United States Patent
Chen

(10) Patent No.: US 10,763,232 B1
(45) Date of Patent: Sep. 1, 2020

(54) ELECTRICAL JOINT STRUCTURE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/367,277

(22) Filed: Mar. 28, 2019

(51) Int. Cl.
*H01L 23/52* (2006.01)
*H01L 23/00* (2006.01)

(52) U.S. Cl.
CPC .... *H01L 24/33* (2013.01); *H01L 2224/33505* (2013.01)

(58) Field of Classification Search
CPC ......... H01L 24/33; H01L 24/32; H01L 24/83; H01L 24/27
USPC ........................................................ 257/734
See application file for complete search history.

(56) References Cited

U.S. PATENT DOCUMENTS 8,931,906 B2 * 1/2015 Huang ............... G03B 21/2033
257/100
9,520,370 B2 * 12/2016 Gandhi ................... H01L 24/03

* cited by examiner

*Primary Examiner* — Luan C Thai
(74) *Attorney, Agent, or Firm* — CKC & Partners Co., LLC

(57) ABSTRACT

An electrical joint structure including a substrate, a multi-layer bonding structure, and a blocking layer is provided. The multi-layer bonding structure is present on the substrate and includes a diffusive metal layer and a tin-rich layer. The diffusive metal layer includes a copper-tin alloy on a surface of the diffusive metal layer. The surface faces the substrate. A thickness of the copper-tin alloy is less than or equal to 2 μm. The tin-rich layer is present on and in contact with the diffusive metal layer. The blocking layer is present between the multi-layer bonding structure and the substrate and at least in contact with a part of said copper-tin alloy, such that the multi-layer bonding structure is spaced apart from the substrate.

12 Claims, 6 Drawing Sheets

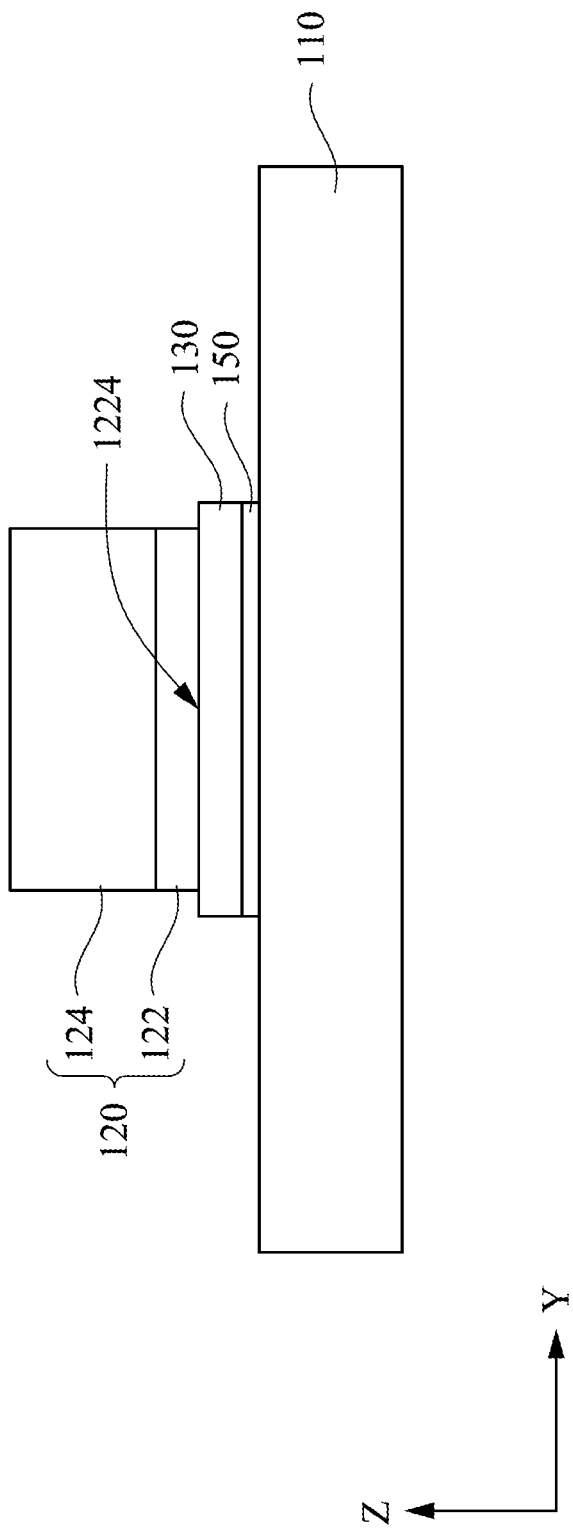

a
ELECTRICAL JOINT STRUCTURE

BACKGROUND

Field of Invention

The present disclosure relates to an electrical joint structure for use in a micro-bonding process.

Description of Related Art

The statements in this section merely provide background information related to the present disclosure and do not necessarily constitute prior art.

In recent years, micro devices have become popular in various applications. Among all technical aspects of micro devices, a suitable micro-bonding process which is different from conventional processes for bonding macroscopic objects, or a suitable micro-bonding structure which is different from a conventional bonding structure used for macroscopic objects is a crucial issue.

SUMMARY

According to some embodiments of the present disclosure, an electrical joint structure including a substrate, a multi-layer bonding structure, and a blocking layer is provided. The multi-layer bonding structure is present on the substrate and includes a diffusive metal layer and a tin-rich layer. The diffusive metal layer includes a copper-tin alloy on a surface of the diffusive metal layer. The surface faces the substrate. A thickness of the copper-tin alloy is less than or equal to 2 µm. The tin-rich layer is present on and in contact with the diffusive metal layer. The blocking layer is present between the multi-layer bonding structure and the substrate and at least in contact with a part of said copper-tin alloy, such that the multi-layer bonding structure is spaced apart from the substrate.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 3 is a cross-sectional view of an electrical joint structure according to some embodiments of the present disclosure;

DETAILED DESCRIPTION

Figure 1:
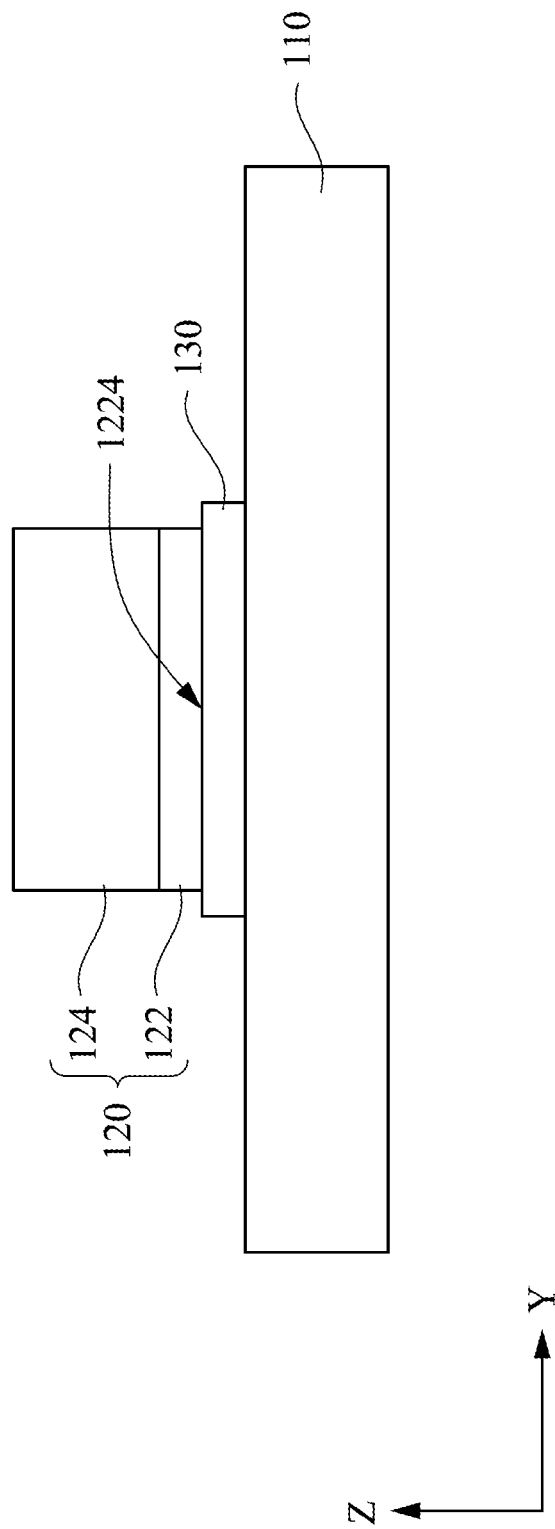
FIG. 1 is a cross-sectional view of an electrical joint structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Although most of terms described in the following disclosure use singular nouns, said terms may also be plural in accordance with figures or practical applications.

Figure 2A:
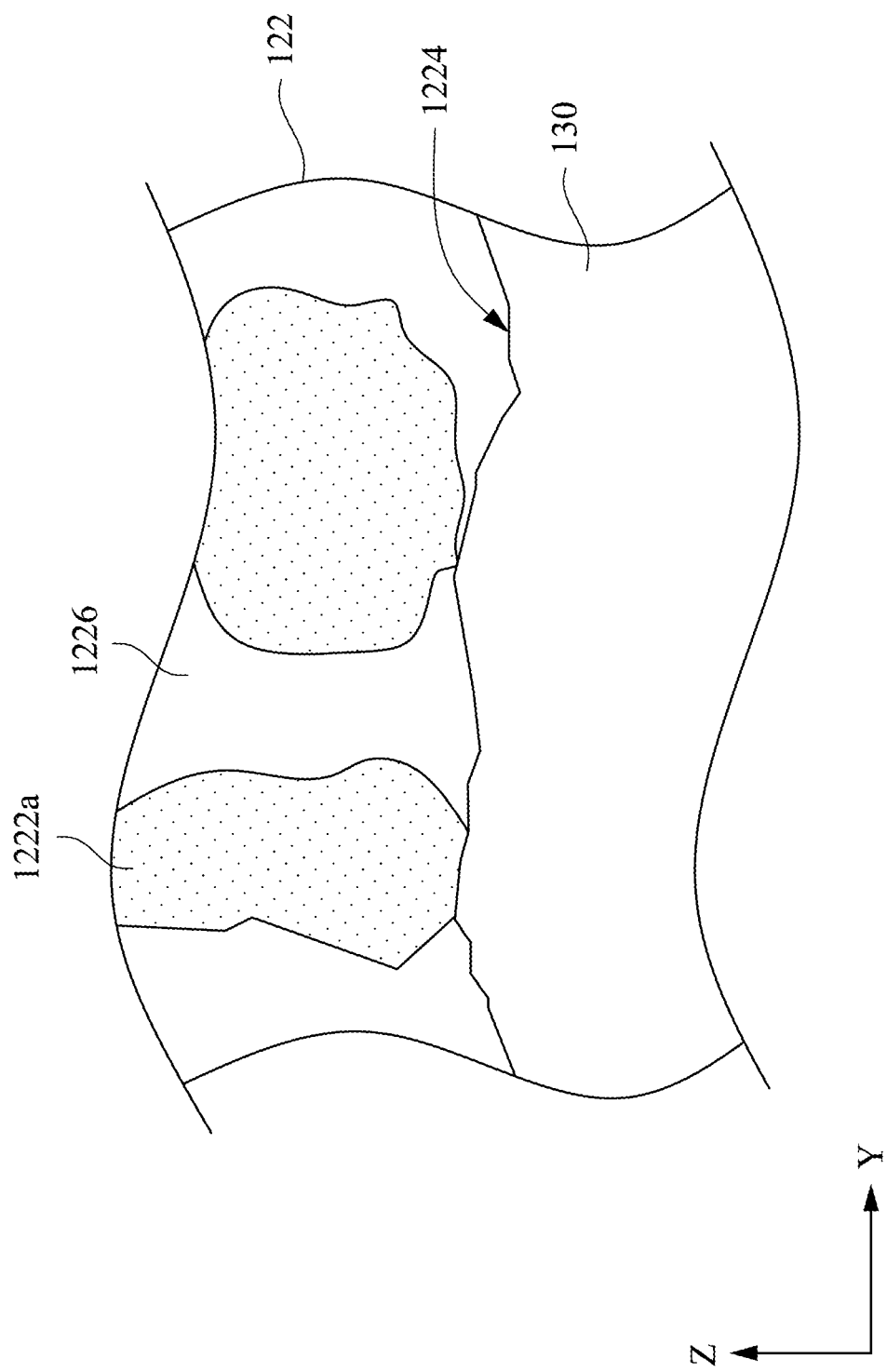
FIG. 2A is an enlarged cross-sectional view of an interface between a diffusive metal layer and a blocking layer according to some embodiments of the present disclosure.
Figure 2B:
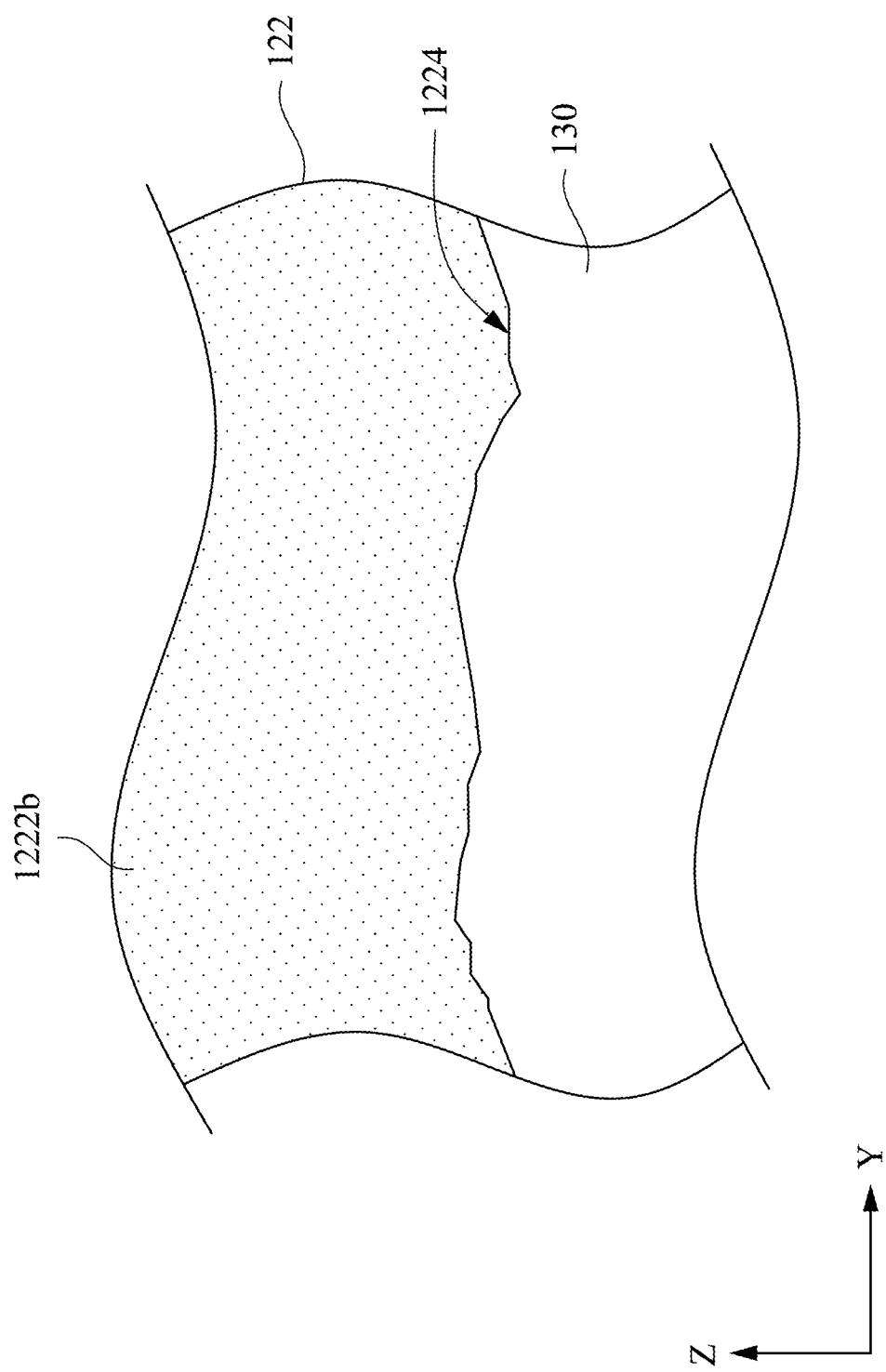
FIG. 2B is an enlarged cross-sectional view of an interface between a diffusive metal layer and a blocking layer according to some embodiments of the present disclosure.

Reference is made to FIGS. 1, 2A, and 2B. FIG. 1 is a cross-sectional view of an electrical joint structure 100A according to some embodiments of the present disclosure. FIG. 2A is an enlarged cross-sectional view of an interface between a diffusive metal layer 122 and a blocking layer 130 according to some embodiments of the present disclosure. FIG. 2B is an enlarged cross-sectional view of an interface between the diffusive metal layer 122 and the blocking layer 130 according to some embodiments of the present disclosure. In some embodiments, an electrical joint structure 100A including a substrate 110, a multi-layer bonding structure 120, and the blocking layer 130 is provided. The multi-layer bonding structure 120 is present on the substrate 110 and includes the diffusive metal layer 122 and a tin-rich layer 124. In some embodiments, the diffusive metal layer 122 includes a copper-tin alloy 1222a as illustrated in FIG. 2A or a copper-tin alloy 1222b as illustrated in FIG. 2B on a surface 1224 of the diffusive metal layer 122. The copper-tin alloys 1222a and 1222b may include $Cu_3Sn$, $Cu_6Sn_5$, or a combination thereof. The surface 1224 of the diffusive metal layer 122 is a surface that faces the substrate 110 when viewed from the diffusive metal layer 122. The tin-rich layer 124 is present on and in contact with the diffusive metal layer 122. In some embodiments, more than 60% of tin (Sn) is present in the tin-rich layer 124. In some embodiments, a thickness of the tin rich layer 124 is greater than about 0.2 µm, and preferably greater than about 0.3 µm. In some embodiments, the thickness of the tin-rich layer 124 is greater than the thickness of the diffusive metal layer 122 at a time the multi-layer bonding structure 120 is formed, such that there is enough Sn for an interstitial diffusion to reach far enough and form the copper-tin alloys 1222a and 1222b on the surface 1224. A measure of the thickness is defined in a direction Z which is perpendicular to an extension of the substrate 110, which is defined in a direction Y. The blocking layer 130 is present between the multi-layer bonding structure 120 and the substrate 110, and the multi-layer bonding structure 120 is spaced apart from the substrate 110 by the blocking layer 130. In some embodiments, the blocking layer 130 is in contact with at least a part of said copper-tin alloy 1222a or 1222b. In some embodiments, the blocking layer 130 includes titanium (Ti), molybdenum (Mo), or a combination thereof. The blocking layer 130 can be used to prevent the copper-tin alloys 1222a and 1222b from contacting the substrate 110, in which said contacting is not desired for adhesion/bonding.

Reference is made to FIG. 3. FIG. 3 is a cross-sectional view of an electrical joint structure 100B according to some embodiments of the present disclosure. A difference between embodiments illustrated by FIG. 3 and the embodiments illustrated by FIG. 1 is that the embodiments illustrated by FIG. 3 further includes an adhesive layer 150 present between the blocking layer 130 and the substrate 110. The adhesive layer 150 may include titanium (Ti), molybdenum (Mo), chromium (Cr), combinations thereof, or the like, so as to firmly bond the blocking layer 130 to the substrate110.

Referring back to FIGS. 1, 2A and 2B. In some embodiments, as shown in FIG. 2A, the diffusive metal layer 122 includes a portion which is substantially copper (Cu) 1226 and a portion which is the copper-tin alloy 1222a. Specifically, after a structure of a combination of the blocking layer 130, the diffusive layer 122, and the tin-rich layer 124 as shown in FIG. 1 is formed, a part of the Cu 1226 in the diffusive metal layer 122 and a part of Sn in the tin-rich layer 124 may start the interstitial diffusion on an interface between the diffusive metal layer 122 and the tin-rich layer124, so as to form the copper-tin alloy 1222a. In the embodiments, as shown in FIG. 2A, both of the copper-tin alloy 1222a and the Cu 1226 are in contact with the blocking layer 130. The copper-tin alloy 1222a is in contact with the blocking layer 130 due to that the diffusive metal layer 122 is thin enough. In some embodiments, a thickness of the diffusive metal layer 122 before the interstitial diffusion is less than 1 μm. Specifically, a thickness of the diffusive metal layer 122 before the interstitial diffusion including substantially Cu 1226 is less than 1 μm at the time a combination of the diffusive metal layer 122 and the tin-rich layer 124 is formed in some embodiments. The restriction of the thickness of the diffusive metal layer 122 before the interstitial diffusion as mentioned is to minimize bending of the substrate 110 after the diffusive metal layer 122 before the interstitial diffusion is formed on the substrate 110 due to different coefficients of thermal conductivity between the diffusive metal layer 122 before the interstitial diffusion (or specifically Cu) and the substrate 110. The substrate 110 can be a glass substrate, a quartz substrate, or a silicon substrate. The substrate 110 can also be a flexible substrate, such as a polycarbonate (PC) substrate or a polyimide (PI) substrate. In some embodiments, a thickness of the copper-tin alloy 1222a or 1222b is less than or equal to 2 μm. In some other embodiments, as shown in FIG. 2B, a contact portion (i.e., the surface 1224) of the diffusive metal layer 122 in contact with the blocking layer 130 is substantially the copper-tin alloy 1222b. A structure of the interface between the multi-layer bonding structure 120 and the blocking layer 130 as shown in FIG. 2B may occur due to that the diffusive metal layer 122 is thin enough, or a duration is long enough for said interstitial diffusion to form a deep mutual penetration between the diffusive metal layer 122 and the tin-rich layer 124.

Figure 4A:
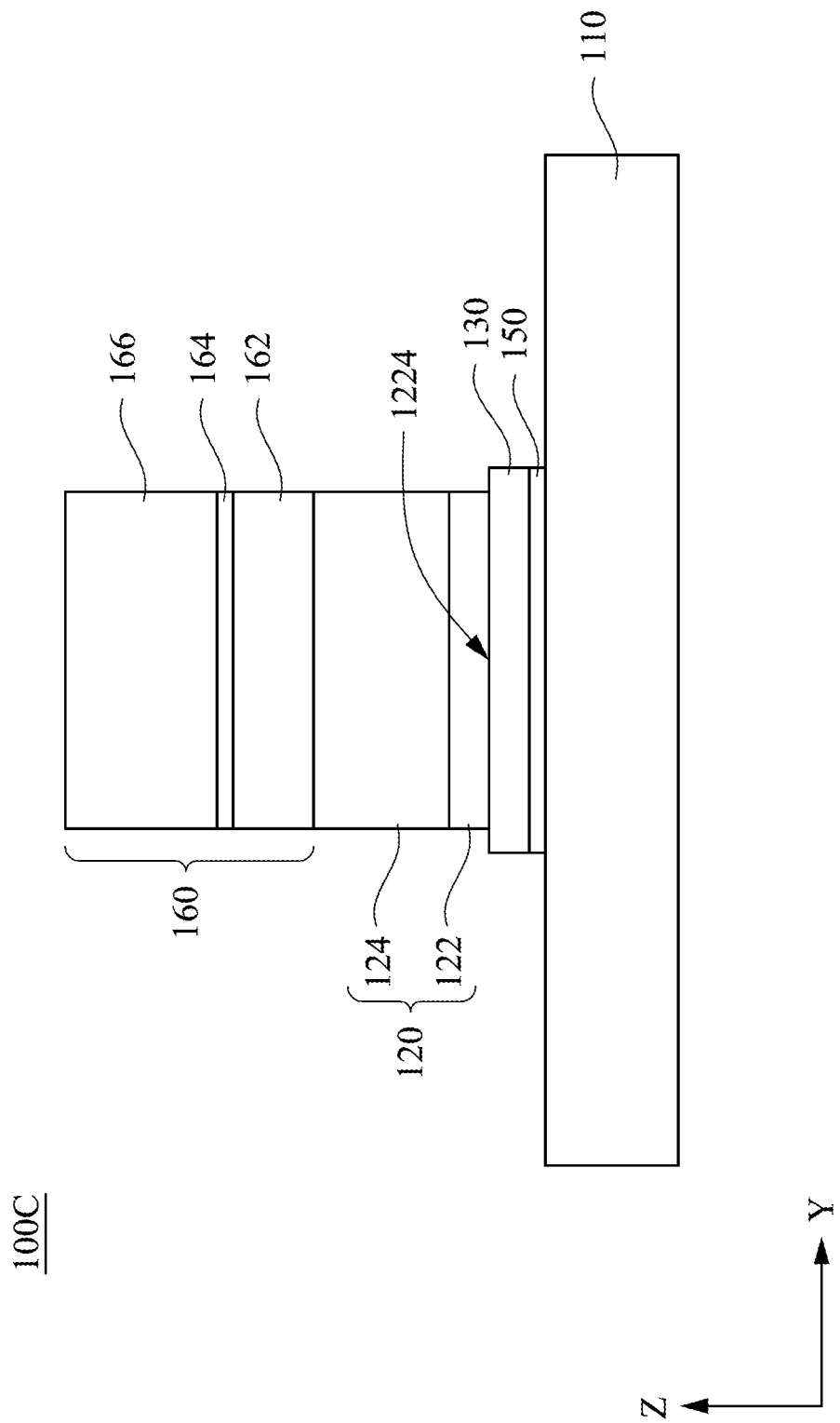
FIG. 4A is a cross-sectional view of an electrical joint structure according to some embodiments of the present disclosure.

Reference is made to FIG. 4A. FIG. 4A is a cross-sectional view of an electrical joint structure 100C according to some embodiments of the present disclosure. In some embodiments, the electrical joint structure 100C further includes a micro device 160 present on the multi-layer bonding structure 120. In some embodiments, the micro device 160 includes a first type semiconductor layer 162, an active layer 164, and a second type semiconductor layer 166. The first type semiconductor layer 162 is in contact with the tin-rich layer 124. The active layer 164 is present on the first type semiconductor layer 162. The second type semiconductor layer 166 is joined with the first type semiconductor layer 162 through the active layer 164.

It should be noted that in the embodiments of the present disclosure, the contact area between the blocking layer 130 and the multi-layer bonding structure 120 is less than or equal to 1 square millimeter since a preferable method for bonding the micro device 160 to the substrate 110 includes forming said liquid layer on the diffusive metal layer 122 before the interstitial diffusion and placing the tin-rich layer 124 with the micro device 160 thereon to a place above the liquid layer such that the tin-rich layer 124 with the micro device 160 is gripped by a capillary force exerted by the liquid layer. The liquid layer can also be formed on the micro device 160 and the substrate 110 after the micro device 160 and the tin-rich layer 124 is placed on the diffusive metal layer 122 before the interstitial diffusion. Said restriction of the contact area to be less than or equal to 1 square millimeter is to generate enough capillary force to grip the tin-rich layer 124 with the micro device 160. In this stage the diffusive metal layer 122 before the interstitial diffusion do not include Sn from the tin-rich layer 124. The term "diffusive" metal layer 122 means a metal layer that tends to diffuse to another layer in contact therewith. After that, the temperature is raised such that the liquid layer is evaporated and the micro device 160 is bind to the diffusive metal layer 122 through the tin-rich layer 124. Finally, the interstitial diffusion occurs and reaches the interface as shown in the embodiments illustrated in FIGS. 2A and/or 2B to form the electrical joint structure 100A, 100B, 100C, or 100D, or the like. Said processes or the like for performing the micro-size bonding is not suitable for the macro-size bonding process due to a weaker capillary force produced by said liquid layer.

Figure 4B:
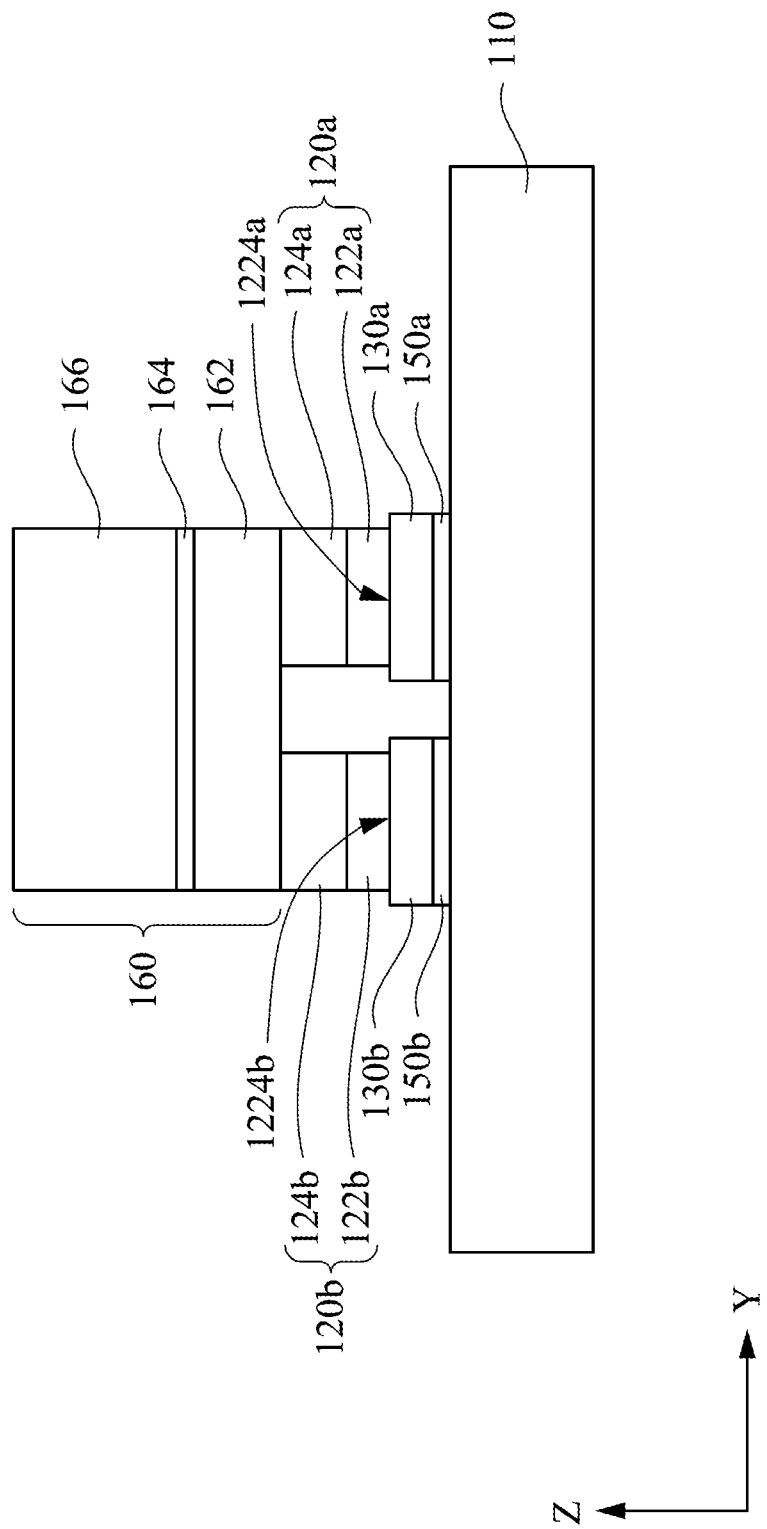
FIG. 4B is a cross-sectional view of an electrical joint structure according to some embodiments of the present disclosure.

Reference is made to FIG. 4B. FIG. 4B is a cross-sectional view of an electrical joint structure 100D according to some embodiments of the present disclosure. A difference between embodiments illustrated by FIG. 4B and the embodiments illustrated by FIG. 4A is that there are two multi-layer bonding structures 120a and 120b present on and respectively in contact with the blocking layers 130a and 130b in the embodiments illustrated by FIG. 4B. The blocking layers 130a and 130b are respectively in contact with the adhesive layers 150a and 150b. The multi-layer bonding structures 120a and 120b are separately in contact with the micro device 160. The multi-layer bonding structure 120a includes a diffusive metal layer 122a and a tin-rich layer 124a. The multi-layer bonding structure 120b includes a diffusive metal layer 122b and a tin-rich layer 124b. A surface 1224a of the diffusive metal layer 122a is a surface that faces the substrate 110 when viewed from the diffusive metal layer 122a. A surface 1224b of the diffusive metal layer 122b is a surface that faces the substrate 110 when viewed from the diffusive metal layer 122b. In some embodiments, a contact area between the blocking layer 130a and the multi-layer bonding structure 120a is less than or equal to 1 square millimeter, and a contact area between the blocking layer 130b and the multi-layer bonding structure 120b is less than or equal to 1 square millimeter.

In summary, as illustrated in each of the embodiments of the present disclosure, an electrical joint structure is used for a micro-size contact in which a thickness of the copper-tin alloy is less than or equal to 2 μm. A blocking layer is in contact with a copper-tin alloy of a multi-layer bonding structure due to an interstitial diffusion of Cu in a diffusive metal layer of the multi-layer bonding structure and Sn in a tin-rich layer of the multi-layer bonding structure. The blocking layer prevents a contact between the copper-tin alloy and the substrate.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrical joint structure, comprising:
   a substrate;
   a multi-layer bonding structure present on the substrate and comprising:
      a diffusive metal layer comprising a copper-tin alloy on a surface of the diffusive metal layer facing the substrate, wherein a thickness of the copper-tin alloy is less than or equal to 2 μm; and
      a tin-rich layer present on and in contact with the diffusive metal layer; and
   a blocking layer present between the multi-layer bonding structure and the substrate and at least in contact with a part of said copper-tin alloy, such that the multi-layer bonding structure is spaced apart from the substrate, wherein a contact area between the blocking layer and the multi-layer bonding structure is less than or equal to 1 square millimeter.

2. The electrical joint structure of claim 1, further comprising an adhesive layer present between the blocking layer and the substrate.

3. The electrical joint structure of claim 2, wherein the adhesive layer comprises titanium, molybdenum, chromium, or combinations thereof.

4. The electrical joint structure of claim 1, wherein more than 60% of Sn present in the tin-rich layer.

5. The electrical joint structure of claim 1, wherein the copper-tin alloy comprises $Cu_3Sn$.

6. The electrical joint structure of claim 1, wherein the copper-tin alloy comprises $Cu_6Sn_5$.

7. The electrical joint structure of claim 1, wherein a thickness of the tin-rich layer is greater than or equal to about 0.2 μm.

8. The electrical joint structure of claim 1, wherein a thickness of the tin-rich layer is greater than or equal to about 0.3 μm.

9. The electrical joint structure of claim 1, wherein the blocking layer comprises titanium, molybdenum, or a combination thereof.

10. The electrical joint structure of claim 1, wherein the diffusive metal layer comprising copper.

11. The electrical joint structure of claim 1, further comprising a micro device present on the multi-layer bonding structure.

12. The electrical joint structure of claim 11, wherein the micro device comprises:
   a first type semiconductor layer in contact with the tin-rich layer;
   an active layer present on the first type semiconductor layer; and
   a second type semiconductor layer joined with the first type semiconductor layer through the active layer.

* * * * *